US012631191B2

(12) United States Patent
Chen et al.

(10) Patent No.: US 12,631,191 B2
(45) Date of Patent: May 19, 2026

(54) FAN AND ELECTRONIC DEVICE EMPLOYING FAN

(71) Applicants:CHAMP TECH OPTICAL (FOSHAN) CORPORATION, Foshan (CN); Foxconn Technology Co., Ltd., New Taipei (TW)

(72) Inventors: Jing-Shu Chen, Foshan (CN); Yong-Kang Zhang, Shenzhen (CN); Yung-Ping Lin, New Taipei (TW)

(73) Assignees: CHAMP TECH OPTICAL (FOSHAN) CORPORATION, Foshan (CN); Foxconn Technology Co., Ltd., New Taipei (TW)

( * ) Notice: Subject to any disclaimer, the term of this patent is extended or adjusted under 35 U.S.C. 154(b) by 0 days.

(21) Appl. No.: 19/021,725

(22) Filed: Jan. 15, 2025

(65) Prior Publication Data

US 2026/0117785 A1 Apr. 30, 2026

(30) Foreign Application Priority Data

Oct. 29, 2024 (CN) .......................... 202411529523.5

(51) Int. Cl.
| | |
|---|---|
| *F04D 29/051* | (2006.01) |
| *F04D 25/06* | (2006.01) |
| *F04D 29/053* | (2006.01) |
| *F04D 29/057* | (2006.01) |
| *H05K 7/20* | (2006.01) |

(52) U.S. Cl.
CPC ......... *F04D 29/0513* (2013.01); *F04D 25/06* (2013.01); *F04D 29/051* (2013.01); *F04D*

*29/053* (2013.01); *F04D 29/057* (2013.01); *H05K 7/20172* (2013.01)

(58) Field of Classification Search
CPC ........................... F04D 29/0513; F04D 29/051
See application file for complete search history.

(56) References Cited

U.S. PATENT DOCUMENTS

| | | | | |
|---|---|---|---|---|
| 4,977,532 A | * | 12/1990 | Borkowicz | ............... G06F 1/18 |
| | | | | 361/741 |
| 2014/0369839 A1 | * | 12/2014 | Tamaoka | .............. F16C 17/107 |
| | | | | 384/114 |

FOREIGN PATENT DOCUMENTS

| | | |
|---|---|---|
| CN | 2561971 | 7/2003 |
| TW | M300725 | 11/2006 |

* cited by examiner

*Primary Examiner* — Courtney D Heinle
*Assistant Examiner* — Danielle M. Christensen
(74) *Attorney, Agent, or Firm* — ScienBiziP, P.C.

(57) ABSTRACT

A fan includes a housing, an impeller, and a bearing. The housing includes a bottom plate and a shaft sleeve with an internal space. The impeller includes a wheel hub, a shaft rod, and a thrust plate. The bearing is arranged in the internal space, the shaft rod is rotatably connected to the shaft sleeve through the bearing. The fan is proved with a first axial dynamic pressure oil circuit, a second axial dynamic pressure oil circuit, a radial dynamic pressure oil circuit, a first oil circuit to a fourth oil circuit. The first oil circuit to the fourth oil circuit are successively connected to form a liquid circuit, the impeller can be in a completely suspended state under a combined action of a first axial dynamic pressure, a second axial dynamic pressure, and a radial dynamic pressure. An electronic device is also provided.

18 Claims, 13 Drawing Sheets

1000

200

300

A

100

A

100

FAN AND ELECTRONIC DEVICE EMPLOYING FAN

FIELD

The present disclosure relates to field of heat dissipation of equipment, and in particular to a fan and an electronic device.

BACKGROUND

A bearing of the current fan is easy to friction with other components, resulting in an abrasion of a shaft rod or the bearing and/or generating noises.

Thus, there is room for improvement within the art.

BRIEF DESCRIPTION OF THE DRAWINGS

Many aspects of the disclosure can be better understood with reference to the following drawings. The assemblies in the drawings are not necessarily drawn to scale, the emphasis instead being placed upon clearly illustrating the principles of the disclosure. Moreover, in the drawings, like reference numerals designate corresponding parts throughout the several views.

FIG. 9 shows a cutaway diagram illustrating the bearing along a D-D line in

FIG. 7.

FIG. 12 shows a cutaway diagram illustrating the bearing along a E-E line in

FIG. 11.

DETAILED DESCRIPTION

Figure 1:
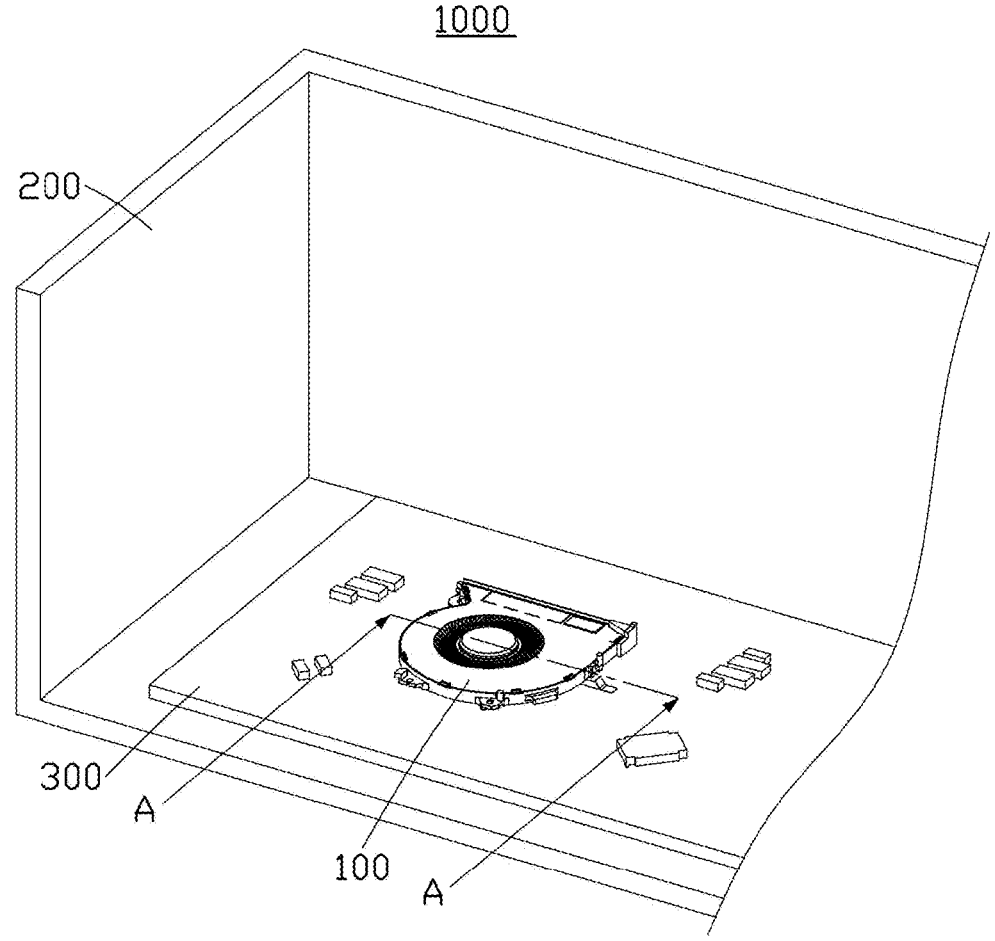
FIG. 1 shows a schematic diagram illustrating a structure of an electronic device according to an embodiment of the present application.
Figure 2:
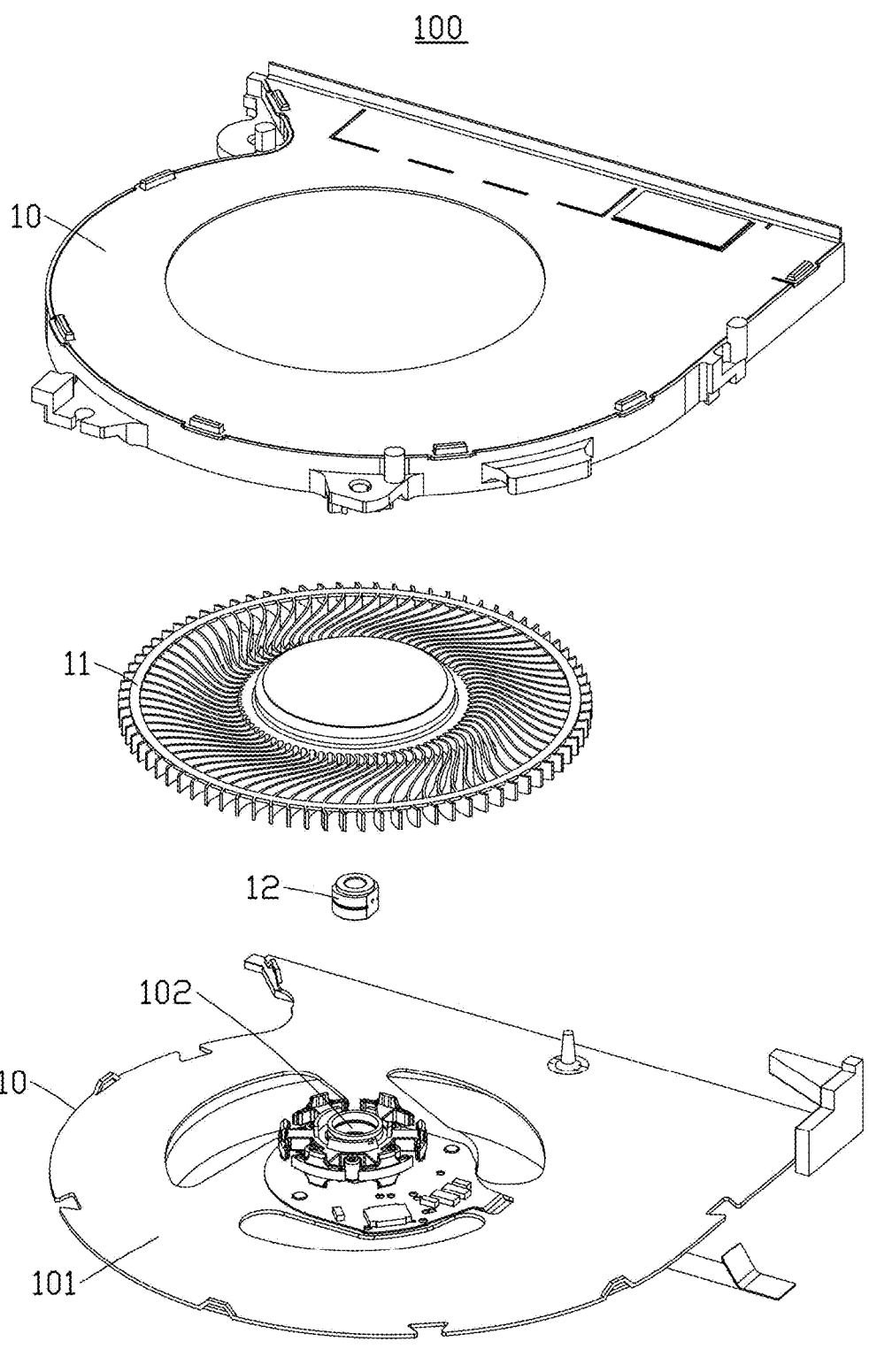
FIG. 2 shows an explosion diagram illustrating a structure of a fan in FIG. 1.
Figure 3:
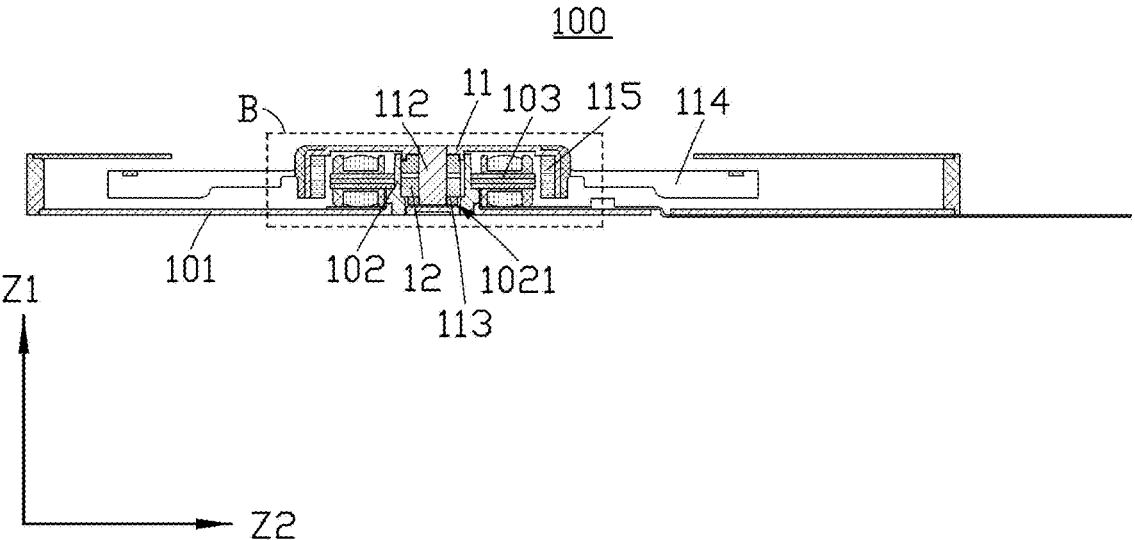
FIG. 3 shows a cutaway diagram illustrating the fan along a A-A line in FIG. 1.
Figure 4:
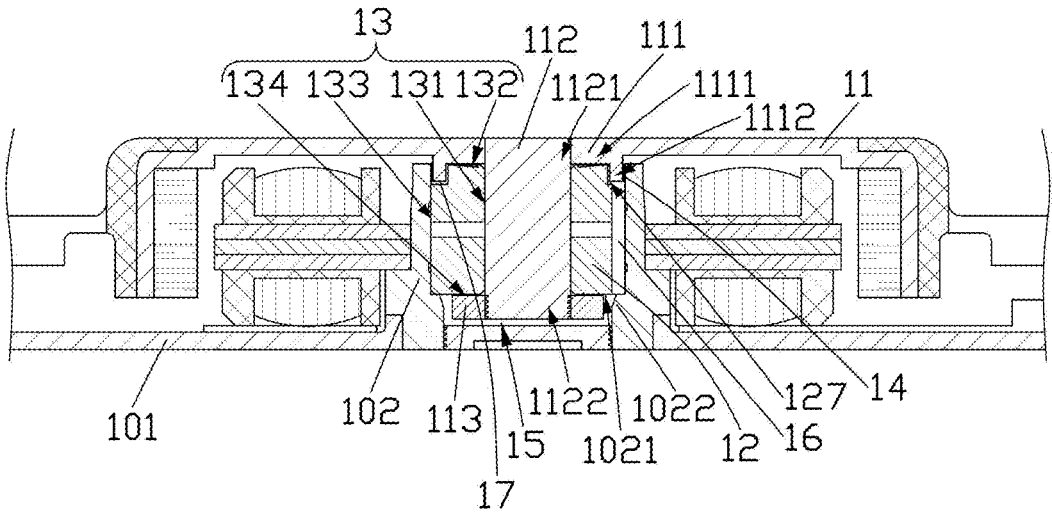
FIG. 4 shows an enlarged diagram illustrating a structure of a part B in FIG. 3 according to an embodiment of the present application.
Figure 5:
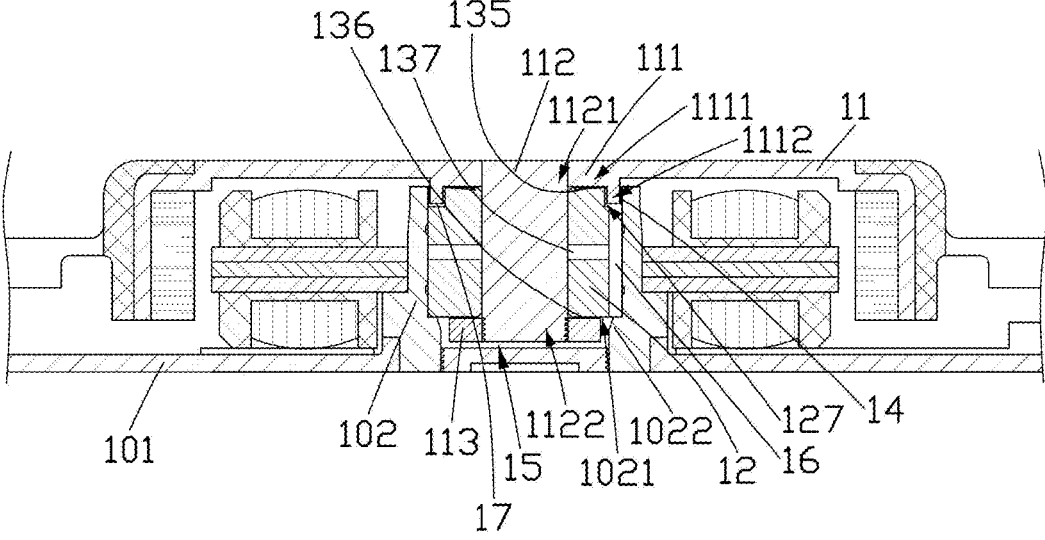
FIG. 5 shows an enlarged diagram illustrating a structure of the part B in FIG. 3 according to another embodiment of the present application.

In order to make the above-mentioned objects, features and advantages of the present application more obvious, a detailed description of specific embodiments of the present application will be described in detail with reference to the accompanying drawings. A number of details are set forth in the following description so as to fully understand the present application. However, the present application can be implemented in many other ways different from those described herein, and those skilled in the art can make similar improvements without violating the contents of the present application. Therefore, the present application is not to be considered as limiting the scope of the embodiments described herein.

Several definitions that apply throughout this disclosure will now be presented.

In the description of the present disclosure, it should be understood that the terms "upper", "lower", "inner", "outer", "axial", "radial", "circumference", etc. indicate the orientation or positional relationship based on the orientation or positional relationship shown in the drawings, it is only for the convenience of describing the present disclosure and simplifying the description, rather than indicating or implying that the device or element referred to must have a specific orientation, be constructed and operated in a specific orientation, and therefore it cannot limit the present disclosure.

In the description of the present disclosure, it should be noted that the terms "installed", "connecting", and "connected" should be interpreted broadly unless otherwise clearly specified and limited. For example, they can be fixed or detachable connected or integrally connected; they can be directly connected, or indirectly connected through intermediate components, and they can be the internal connections between two components. For those of ordinary skill in the art, the specific meanings of the above-mentioned terms in the present disclosure can be understood in specific situations.

Unless otherwise defined, all technical and scientific terms used herein have the same meaning as commonly understood by one skilled in the art. The terms used in a specification of the present application herein are only for describing specific embodiments and are not intended to limit the present application. The terms "and/or" used herein includes any and all combinations of one or more of associated listed items.

Referring to FIG. 1, one embodiment provides an electronic device 1000. The electronic device 1000 may include a fan 100, a cabinet 200, and an electronic component 300. The electronic component 300 is arranged in the cabinet 200. The fan 100 is arranged in the cabinet 200 and configured to dissipate heat from the electronic component 300 or the cabinet 200.

Referring to FIG. 2 to FIG. 9, the fan 100 may include a housing 10, an impeller 11, a bearing 12, a first axial dynamic pressure oil circuit 135, a second axial dynamic pressure oil circuit 136, and a radial dynamic pressure oil circuit 137.

The housing 10 may include a bottom plate 101 and a shaft sleeve 102 with an internal space 1021. The shaft sleeve 102 is connected with the bottom plate 101. The impeller 11 may include a wheel hub 111, a shaft rod 112, and a thrust plate 113. The shaft rod 112 includes a first end 1121 and a second end 1122 opposite along an axial direction Z1. The first end 1121 of the shaft rod 112 is connected with the wheel hub 111, the second end 1122 of the shaft rod 112 extends into the internal space 1021. The thrust plate 113 is connected to the second end 1122 of the shaft rod 112. The bearing 12 is arranged in the internal space 1021. The shaft rod 112 is rotatably connected to the shaft sleeve 102 through the bearing 12. The bearing 12 is located between the wheel hub 111 and the thrust plate 113, the bearing 12 has a first end surface 121 and a second end surface 122 opposite along the axial direction Z1. The bearing 12 may further have an inner circumference surface 123 and an outer circumference surface 124.

The first axial dynamic pressure oil circuit 135 is connected with a surface of the impeller 11 perpendicular to the axial direction Z1, and the first axial dynamic pressure oil circuit 135 is configured to generate a first axial dynamic pressure. The second axial dynamic pressure oil circuit 136 is arranged correspondingly with the first axial dynamic pressure oil circuit 135, and the second axial dynamic pressure oil circuit 136 is configured to generate a second axial dynamic pressure. The radial dynamic pressure oil circuit 137 is arranged between the inner circumference surface 123 of the bearing 12 and an outer circumference surface of the shaft rod 112, and the radial dynamic pressure oil circuit 137 is configured to generate a radial dynamic pressure.

A first oil circuit 131 is existed between the inner circumference surface 123 of the bearing 12 and the outer circumference surface of the shaft rod 112, a second oil circuit 132 is existed between the first end surface 121 and the wheel hub 111, a third oil circuit 133 is existed between the outer circumference surface 124 of the bearing 12 and the shaft sleeve 102, and a fourth oil circuit 134 is existed between the second end surface 122 and the thrust plate 113. The first oil circuit 131, the second oil circuit 132, the third oil circuit 133, and the fourth oil circuit 134 are successively connected to form a liquid circuit 13. The impeller 11 can be in a completely suspended state under a combined action of the first axial dynamic pressure, the second axial dynamic pressure, and the radial dynamic pressure.

In one embodiment, the axial direction Z1 can be an extension direction of a rotation axial of the fan 100.

In one embodiment, a lubricating oil can be set in the liquid circuit 13, and the lubricating oil can circulate in the liquid circuit 13. The impeller 11 can be in the completely suspended state under a combined action of the lubricating oil, the first axial dynamic pressure, the second axial dynamic pressure and the radial dynamic pressure, which can reduce a friction caused by a rotation of the impeller 11, suppress a deflection of the impeller 11, and reduce a temperature rise of bearing 12. Thus, noises generated by the rotation of the fan 100 can be reduced, an abrasion of the fan 100 can be reduced, a sound quality of the fan 100 can be improved, and an operating life of the fan 100 can be extended.

In one embodiment, a value of the first axial dynamic pressure is equal to a value of the second axial dynamic pressure, a direction of the first axial dynamic pressure is opposite to a direction of the second axial dynamic pressure, and the first axial dynamic pressure and the second axial dynamic pressure act on the impeller 11 simultaneously, so that the impeller 11 can be in the completely suspended state.

In one embodiment, the first axial dynamic pressure oil circuit 135 is arranged between the first end surface 121 and the wheel hub 111, and the second axial dynamic pressure oil circuit 136 is arranged between the second end surface 122 and the thrust plate 113. When the fan 100 operates, the first axial dynamic pressure oil circuit 135 generates the first axial dynamic pressure, and the second axial dynamic pressure oil circuit 136 generates the second axial dynamic pressure. The first axial dynamic pressure and the second axial dynamic pressure act together to suspend the impeller 11 along the axial direction Z1.

Figure 6:
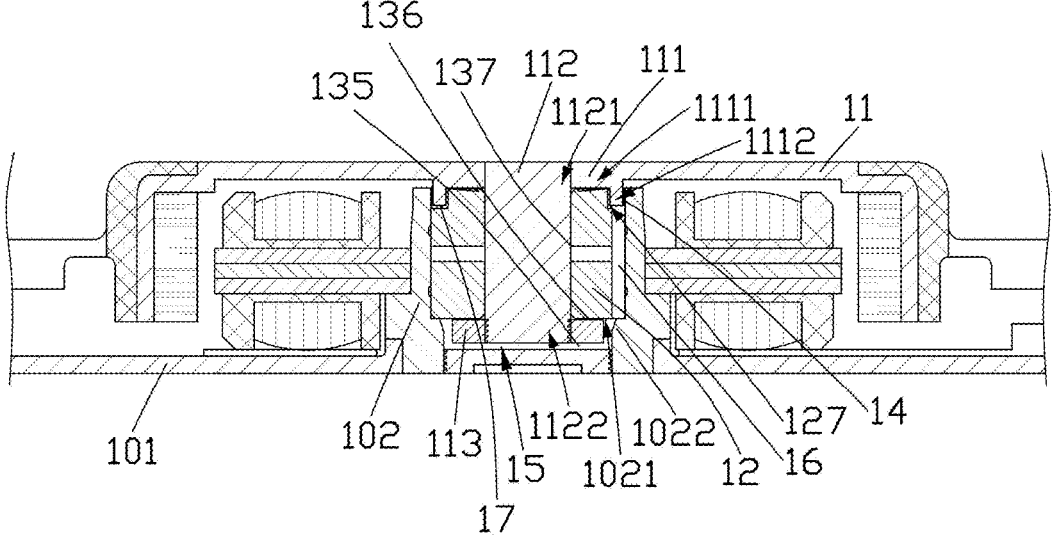
FIG. 6 shows an enlarged diagram illustrating a structure of the part B in FIG. 3 according to another embodiment of the present application.
Figure 7:
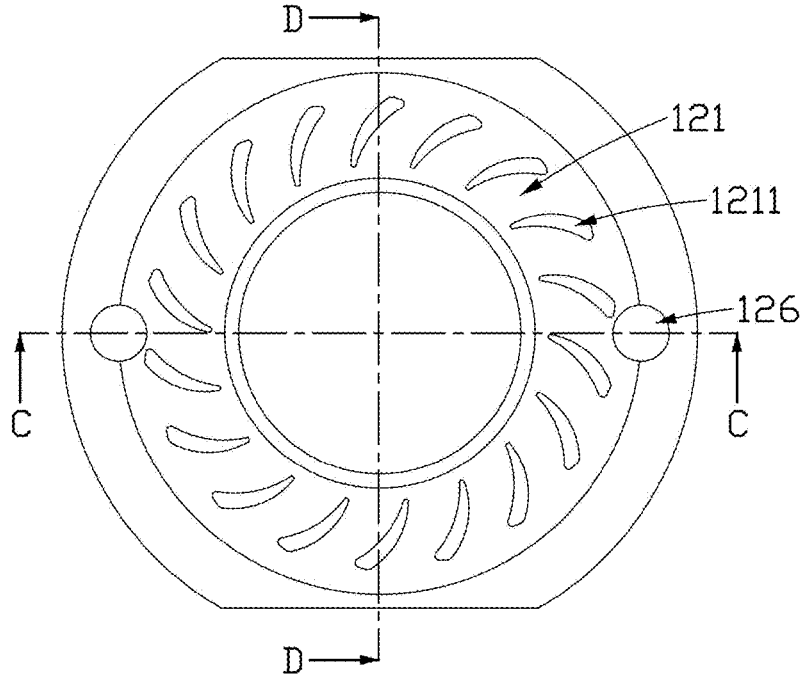
FIG. 7 shows a top view diagram illustrating a structure of a bearing in FIG. 2.
Figure 8:
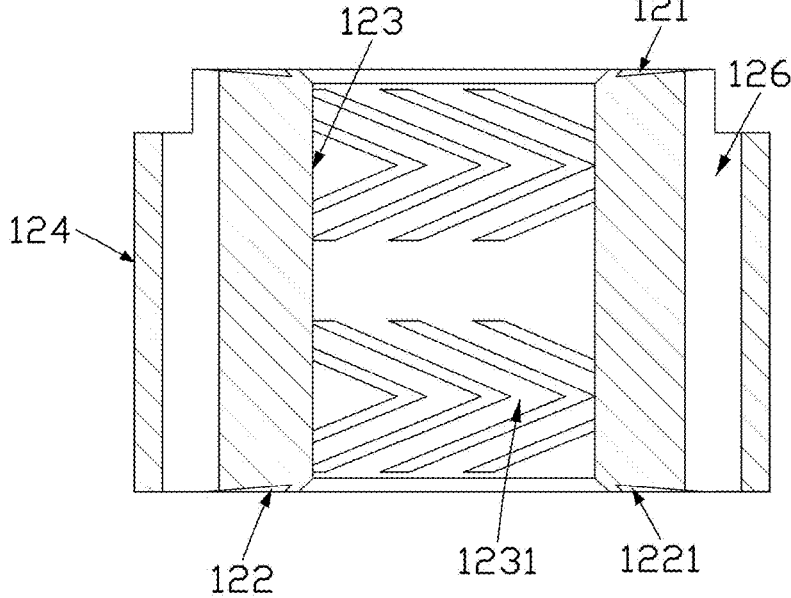
FIG. 8 shows a cutaway diagram illustrating the bearing along a C-C line in FIG. 7.
Figure 9:
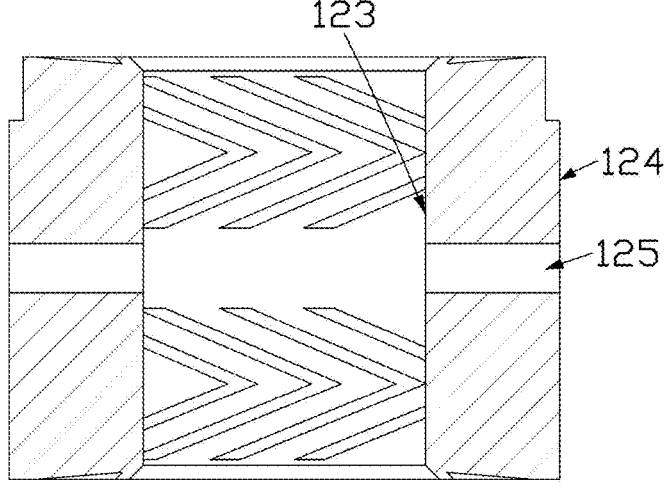
Figure 10:
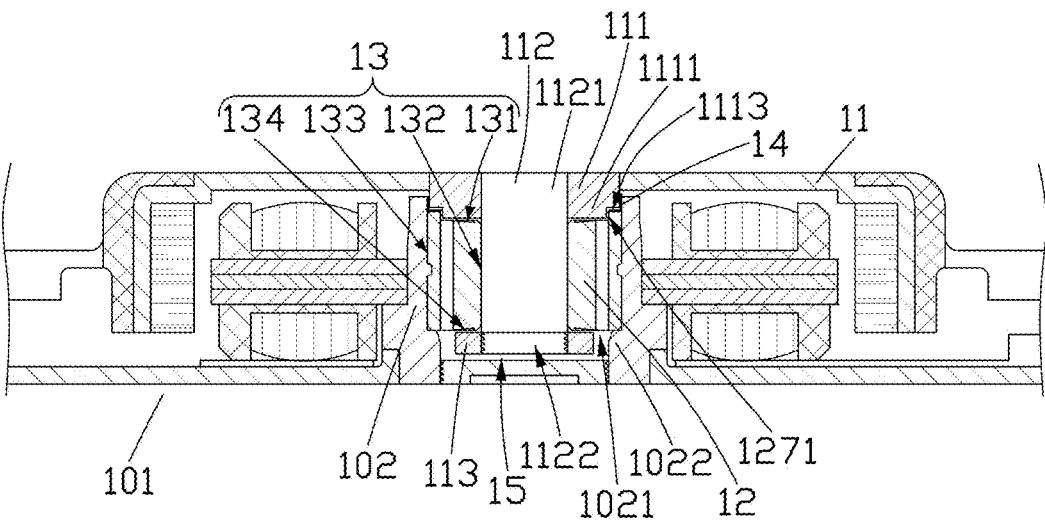
FIG. 10 shows an enlarged diagram illustrating a structure of a part in FIG. 3 according to another embodiment of the present application.
Figure 11:
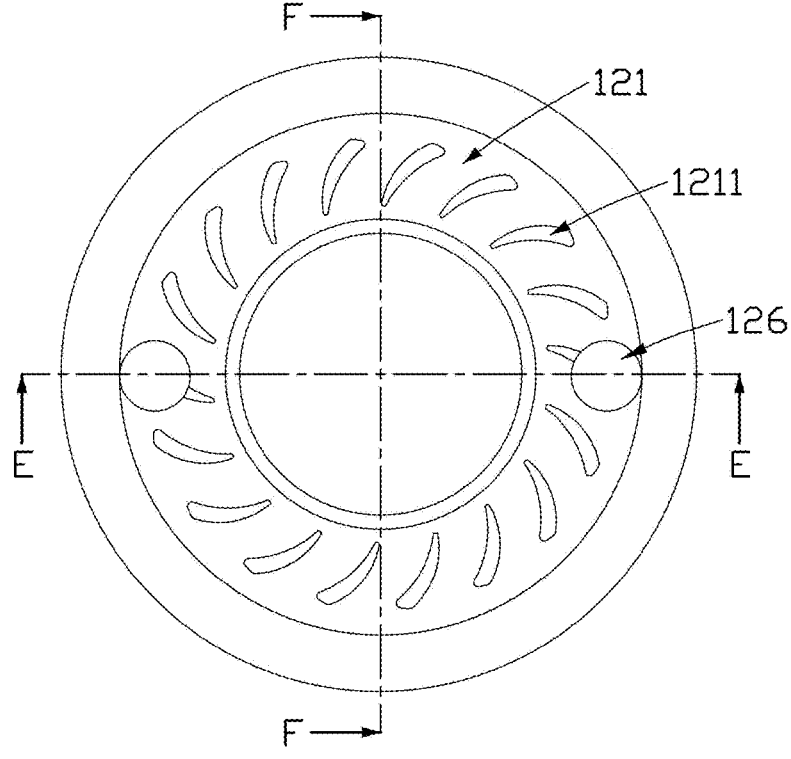
FIG. 11 shows a top view diagram illustrating a structure of the bearing in FIG. 10.
Figure 12:
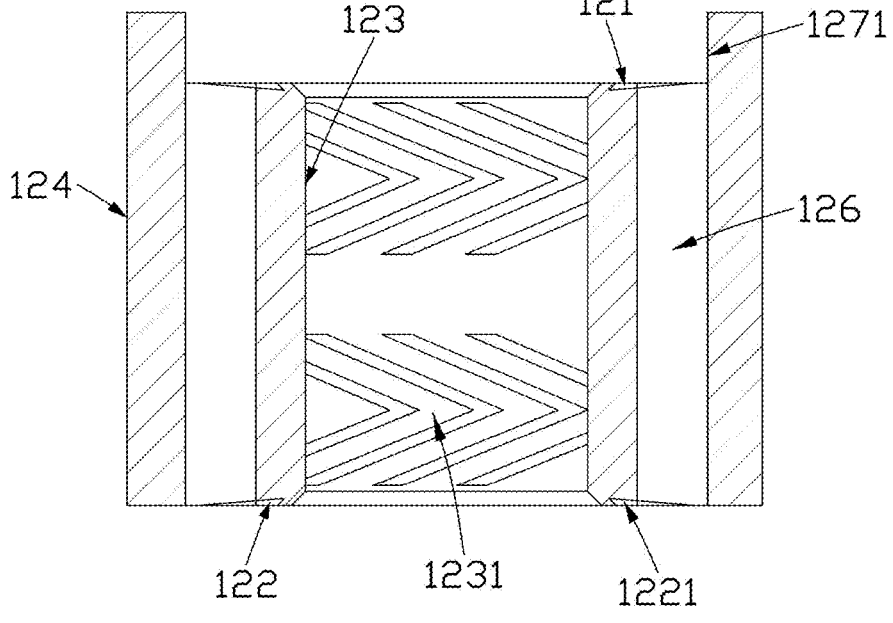
Figure 13:
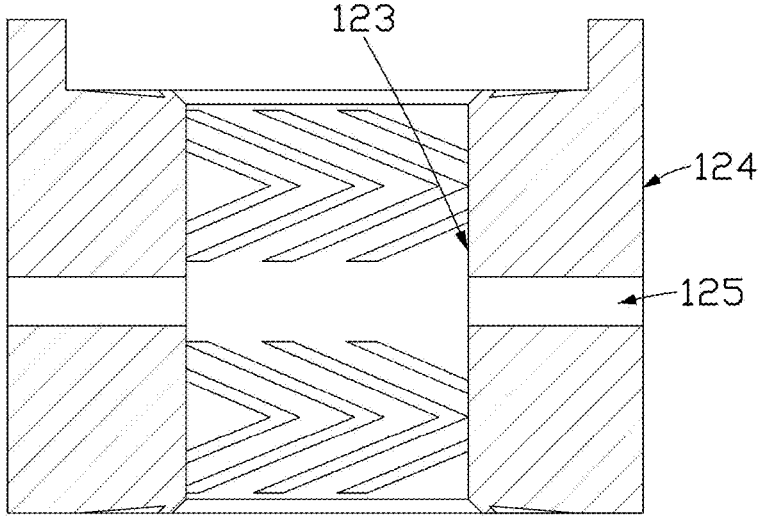
FIG. 13 shows a cutaway diagram illustrating the bearing along a F-F line in FIG. 11.

In one embodiment, as shown in FIG. 6, the first axial dynamic pressure oil circuit 135 is arranged between the thrust plate 113 and the bottom plate 101, and the second axial dynamic pressure oil circuit 136 is arranged between the second end surface 122 and the thrust plate 113. When the fan 100 operates, the first axial dynamic pressure is balanced with the second axial dynamic pressure, thus the impeller 11 is suspended along the axial direction Z1.

In one embodiment, the bearing 12 is further provided with a first communication hole 125, the first communication hole 125 passes through the inner circumference surface 123 and the outer circumference surface 124 of the bearing 12. The first communication hole 125 is located between the first end surface 121 and the second end surface 122, and the first communication hole 125 is connected with the first oil circuit 131 and the third oil circuit 133.

In one embodiment, the first communication hole 125 connects the first oil circuit 131 and the third oil circuit 133, the lubricating oil accelerates a radial flow velocity through the first communication hole 125.

In one embodiment, the number of the first communication hole 125 can be zero, one, two, three or more.

In one embodiment, the bearing 12 is further provided with a second communication hole 126, the second communication hole 126 passes through the first end surface 121 and the second end surface 122, and the second communication hole 126 is connected with the second oil circuit 132 and the fourth oil circuit 134.

In one embodiment, the second communication hole 126 connects the second oil circuit 132 and the fourth oil circuit 134, the lubricating oil accelerates an axial flow velocity through the second communication hole 126.

In one embodiment, the number of the second communication hole 126 can be zero, one, two, three or more.

In one embodiment, the inner circumference surface 123 of the bearing 12 is provided with a first dynamic pressure groove 1231, and the radial dynamic pressure oil circuit 137 is formed between the first dynamic pressure groove 1231 and the outer circumference surface of the shaft rod 112.

In one embodiment, the first end surface 121 is provided with a second dynamic pressure groove 1211, and the second dynamic pressure groove 1211 is cooperated with the wheel hub 111 to form the first axial dynamic pressure oil circuit 135.

In one embodiment, the second end surface 122 is provided with a third dynamic pressure groove 1221, and the third dynamic pressure groove 1221 is cooperated with the thrust plate 113 to form the second axial dynamic pressure oil circuit 136.

In one embodiment, the first oil circuit 131 is formed by a clearance between the shaft rod 112 and the inner circumference surface 123 of the bearing 12 and a slot space of the first dynamic pressure groove 1231. The second oil circuit 132 is formed by a clearance between the first end surface 121 of the bearing 12 and the wheel hub 111 and a slot space of the second dynamic pressure groove 1211. The third oil circuit 133 is formed by a clearance between the outer circumference surface 124 of the bearing 12 and an inner ring surface of the shaft sleeve 102, and the fourth oil circuit 134 is formed by a clearance between the second end surface 122 of the bearing 12 and the thrust plate 113 and a slot space of the third dynamic pressure groove 1221.

In one embodiment, an included angle is existed between the first dynamic pressure groove 1231 and a horizontal plane, and when the bearing 12 rotates, the first dynamic pressure groove 1231 generates a radial dynamic pressure, which enables the lubricating oil to flow in the first dynamic pressure groove 1231.

In one embodiment, an included angle is existed between the second dynamic pressure groove 1211 and a radial direction of the first end surface 121 of the bearing 12. When the bearing 12 rotates, the second dynamic pressure groove 1211 generates an axial dynamic pressure, which enables the lubricating oil to flow in the second dynamic pressure groove 1211.

In one embodiment, an included angle is existed between the third dynamic pressure groove 1221 and a radial direction of the second end surface 122 of the bearing 12. When the bearing 12 rotates, the third dynamic pressure groove 1221 generates an axial dynamic pressure, which enables the lubricating oil to flow in the third dynamic pressure groove 1221.

In one embodiment, the fan 100 includes the second oil circuit 132, the fourth oil circuit 134, and the second communication hole 126 along a radial direction Z2, and the lubricating oil can flow in the second oil circuit 132, the fourth oil circuit 134, and the second communication hole 126 along the radial direction Z2. The fan 100 further includes the first oil circuit 131, the third oil circuit 133, and the first communication hole 125 along the axial direction Z1, and the lubricating oil can flow in the first oil circuit 131, the third oil circuit 133, and the first communication hole 125 along the axial direction Z1. The number of the first communication hole 125 and the second communication hole 126 can be set and/or adjusted according to a rotation speed of the fan 100, to adjust a flow rate of the lubricating oil in the radial direction Z2 and the axial direction Z1, thus the impeller 11 can be in a completely suspended state.

In one embodiment, the radial direction Z2 can be perpendicular to the axial direction Z1.

In one embodiment, the outer circumference surface 121 of the bearing 12 is provided with an excised portion 1241, the excised portion 1241 passes through the first end surface 121 and the second end surface 122 along the axial direction Z1, to provide an external communication passage 16 between the bearing 12 and the shaft sleeve 102

In one embodiment, the number of the excised portion 1241 may be one, two or more to form a corresponding number of external communication passages 16.

In one embodiment, the external communication passages 16 of vertical is formed between the bearing 12 and the shaft sleeve 102 after removing the excised portion 1241 from the bearing 12, increasing the flow velocity of the lubricating oil along the axial direction Z1.

In one embodiment, the number of the excised portion 1241 can be adjusted according to a rotation speed of the bearing 12, to adjust the flow speed of the lubricating oil along the axial direction Z1, thus the impeller 11 can be in a completely suspended state.

In one embodiment, the wheel hub 111 is provided with a thrust portion 1111, the bearing 12 is sandwiched between the thrust portion 1111 and the thrust plate 113. An outer edge of the first end surface 121 of the bearing 12 is concaved to form a first ring groove 127. The thrust portion 1111 may include a first convex ring 1112, and the first convex ring 1112 is cooperated with the first ring groove 127.

In one embodiment, referring to FIG. 10 to FIG. 13, the thrust portion 1111 is further provided with a second ring groove 1113. A second groove is formed by concaving an outer edge of an end surface of the thrust portion 1111 along the axial direction Z1. A radial outer edge of the first end surface 121 of the bearing 12 is convex to form a second convex ring 1271, the second convex ring 1271 corresponds to the second ring groove 1113 along the axial direction Z1, and the second convex ring 1271 can extend vertically into the second ring groove 1113.

In other embodiment, the thrust portion 1111 and the bearing 12 may also be designed as other structures that form a stepped fit.

Referring to FIG. 2 to FIG. 7, a L-shaped communication gap 17 is formed between the first convex ring 1112 and the first ring groove 127. An axial end of the shaft sleeve 102 is clamped to an outer side of the first convex ring 1112, and an outlet gap is formed between the first convex ring 1112 and the shaft sleeve 102. A sealing layer 14 can be provided in the outlet gap for blocking the communication gap 17.

In one embodiment, the thrust portion 1111 and the first ring groove 127 form a stepped fit to limit the bearing 12 along the radial direction Z2, and a radial outer portion of an outer ring surface of the thrust portion 1111 corresponds to the shaft sleeve 102, thus a clearance is formed between the shaft sleeve 102 and the thrust portion 1111 to accommodate the sealing layer 14.

In one embodiment, the sealing layer can be made of an oil stripper or other chemical materials that can prevent a removal or loss of the lubricating oil.

In one embodiment, the shaft sleeve 102 may include a limiting boss 1022, the limiting boss 1022 is arranged on one side of the shaft sleeve 102 along the axial direction Z1 away from the wheel hub 111. The second end surface 122 is cooperated with the limiting boss 1022 to form an oil storage space 15 between the second end surface 122 and the bottom plate 101. The oil storage space 15 can be configured to store the lubricating oil.

In one embodiment, the oil storage space 15 is connected with the fourth oil circuit 134 for connecting to the liquid circuit 13, thus the lubricating oil can flow in the liquid circuit 13.

In one embodiment, the limiting boss 1022 is configured to limit the bearing 12 along the axial direction Z1, keeping the thrust plate 113 at a certain distance from the bottom plate 101, reducing a friction generated during a rotation of the impeller 11.

In one embodiment, the fan 100 may further include a stator 103 connected to an outer ring surface of the shaft sleeve 102. The impeller 11 may further include a fan blade 114 and a rotor 115. The fan blade 114 is connected to the wheel hub 111, and the rotor 115 is connected to the wheel hub 111. The rotor 115 corresponds the stator 103 along the radial direction Z2, thus the rotor 115 can interact with the stator 103 to rotate, and drive the impeller 11 to rotate relative to the housing 10.

The fan blade 114 corresponds to the stator 103 along a circumference direction, the fan blade 114 can be rotated under a combined action of the stator 103 and the rotor 115.

In one embodiment, the number of the fan blade 114 can be one, two or more.

The fan 100 of the embodiments includes the housing 10, the impeller 11, and the bearing 12. The housing 10 includes the bottom plate 101 and the shaft sleeve 102 with the internal space 1021. The impeller 11 includes the wheel hub 111, the shaft rod 112, and the thrust plate 113. The bearing 12 cooperates with shaft rod 112, and the bearing 12 is arranged between the wheel hub 111 and the thrust plate 113. The bearing 12 has the first end surface 121, the second end surface 122, the inner circumference surface 123, and the outer circumference surface 124. The first oil circuit 131 is configured between the inner circumference surface 123 of the bearing 12 and the outer circumference surface of the shaft rod 112, the second oil circuit 132 is configured between the first end surface 121 and the wheel hub 111, the third oil circuit 133 is configured between the outer circumference surface 124 of the bearing 12 and the shaft sleeve 102, and the fourth oil circuit 134 is configured between the second end surface 122 and the thrust plate 113. The first oil circuit to the fourth oil circuit 131~134 are successively connected to form the liquid circuit 13. The liquid circuit 13 contains the lubricating oil. When the impeller 11 rotates, the first oil circuit 131, the second oil circuit 132, the third oil circuit 133, and the fourth oil circuit 134 can generate the axial dynamic pressure and the radial dynamic pressure, thus the lubricating oil can circulate in the liquid circuit 13, the impeller 11 can be in a completely suspended state, reducing the friction caused by the rotation of the fan 100 and improving the sound quality of the fan 100. In addition, the operation life of the fan 100 can be improved.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A fan, comprising:

a housing, comprising a bottom plate and a shaft sleeve with an internal space, the shaft sleeve being connected with the bottom plate;

an impeller comprising a wheel hub, a shaft rod, and a thrust plate, wherein the shaft rod comprising a first end and a second end opposite along an axial direction, the first end of the shaft rod is connected with the wheel hub, the second end of the shaft rod extends into the internal space, and the thrust plate is connected to the second end of the shaft rod;

a bearing, arranged in the internal space, wherein the shaft rod is rotatably connected to the shaft sleeve through the bearing, the bearing is located between the wheel hub and the thrust plate, the bearing has a first end surface and a second end surface opposite along the axial direction, and the bearing further has an inner circumference surface and an outer circumference surface;

a first axial dynamic pressure oil circuit, connected with a surface of the impeller perpendicular to the axial direction, wherein the first axial dynamic pressure oil circuit is configured to generate a first axial dynamic pressure;

a second axial dynamic pressure oil circuit, arranged correspondingly with the first axial dynamic pressure oil circuit, wherein the second axial dynamic pressure oil circuit is configured to generate a second axial dynamic pressure; and a radial dynamic pressure oil circuit, arranged between the inner circumference surface of the bearing and an outer circumference surface of the shaft rod, wherein the radial dynamic pressure oil circuit is configured to generate a radial dynamic pressure;

wherein a first oil circuit is existed between the inner circumference surface of the bearing and the outer circumference surface of the shaft rod, a second oil circuit is existed between the first end surface and the wheel hub, a third oil circuit is existed between the outer circumference surface of the bearing and the shaft sleeve, and a fourth oil circuit is existed between the second end surface and the thrust plate;

the first oil circuit, the second oil circuit, the third oil circuit, and the fourth oil circuit are successively connected to form a liquid circuit; the impeller can be in a completely suspended state under a combined action of the first axial dynamic pressure, the second axial dynamic pressure, and the radial dynamic pressure; and wherein the bearing is further provided with a first communication hole, the first communication hole passes through the first end surface and the second end surface, and the first communication hole is connected with the second oil circuit and the fourth oil circuit.

2. The fan as claimed in claim 1, wherein the bearing is further provided with a second communication hole, the second communication hole passes through the inner circumference surface and the outer circumference surface of the bearing; the second communication hole is located between the first end surface and the second end surface, and the second communication hole is connected with the first oil circuit and the third oil circuit.

3. The fan as claimed in claim 1, wherein the inner circumference surface of the bearing is provided with a first dynamic pressure groove, and the radial dynamic pressure oil circuit is formed between the first dynamic pressure groove and the outer circumference surface of the shaft rod.

4. The fan as claimed in claim 1, wherein the first end surface is provided with a second dynamic pressure groove, and the second dynamic pressure groove is cooperated with the wheel hub to form the first axial dynamic pressure oil circuit.

5. The fan as claimed in claim 1, wherein the second end surface is provided with a third dynamic pressure groove, and the third dynamic pressure groove is cooperated with the thrust plate to form the second axial dynamic pressure oil circuit.

6. The fan as claimed in claim 1, wherein the outer circumference surface of the bearing is provided with an excised portion, the excised portion passes through the first end surface and the second end surface along the axial direction, to provide an external communication passage between the bearing and the shaft sleeve.

7. The fan as claimed in claim 1, wherein the wheel hub is provided with a thrust portion, the bearing is sandwiched between the thrust portion and the thrust plate; an outer edge of the first end surface is concaved to form a first ring groove; the thrust portion comprises a first convex ring, and the first convex ring is cooperated with the first ring groove.

8. The fan as claimed in claim 7, wherein a L-shaped communication gap is formed between the first convex ring and the first ring groove; an axial end of the shaft sleeve is clamped to an outer side of the first convex ring, and an outlet gap is formed between the first convex ring and the shaft sleeve; and a sealing layer is provided in the outlet gap for blocking the communication gap.

9. The fan as claimed in claim 1, wherein the shaft sleeve comprises a limiting boss, the limiting boss is arranged on one side of the shaft sleeve along the axial direction away from the wheel hub, the second end surface is cooperated with the limiting boss to form an oil storage space between the second end surface and the bottom plate, the oil storage space is connected with the fourth oil circuit.

10. The fan as claimed in claim 1, further comprising a stator connected to an outer ring surface of the shaft sleeve, wherein the impeller further comprises a rotor and a fan blade, the fan blade is connected to the wheel hub and corresponds to the stator along a circumference direction, the fan blade is rotated under a combined action of the stator and the rotor.

11. An electronic device, comprising:

a cabinet;

an electronic component, arranged in the cabinet;

a fan, arranged in the cabinet and configured to dissipate heat from the electronic component or the cabinet, wherein the fan comprises:

a housing comprising a bottom plate and a shaft sleeve with an internal space, the shaft sleeve is connected with the bottom plate;

an impeller comprising a wheel hub, a shaft rod, and a thrust plate, the shaft rod comprises a first end and a second end opposite along an axial direction, the first end of the shaft rod is connected with the wheel hub, the second end of the shaft rod extends into the internal space, and the thrust plate is connected to the second end of the shaft rod;

a bearing arranged in the internal space, the shaft rod is rotatably connected to the shaft sleeve through the bearing, the bearing is located between the wheel hub and the thrust plate, the bearing has a first end surface and a second end surface opposite along the axial direction, and the bearing further has an inner circumference surface and an outer circumference surface;

a first axial dynamic pressure oil circuit connected with a surface of the impeller perpendicular to the axial direction, the first axial dynamic pressure oil circuit is configured to generate a first axial dynamic pressure;

a second axial dynamic pressure oil circuit arranged correspondingly with the first axial dynamic pressure oil circuit, the second axial dynamic pressure oil circuit is configured to generate a second axial dynamic pressure; and a radial dynamic pressure oil circuit arranged between the inner circumference surface of the bearing and an outer circumference surface of the shaft rod, the radial dynamic pressure oil circuit is configured to generate a radial dynamic pressure;

wherein a first oil circuit is existed between the inner circumference surface of the bearing and the outer circumference surface of the shaft rod, a second oil circuit is existed between the first end surface and the wheel hub, a third oil circuit is existed between the outer circumference surface of the bearing and the shaft sleeve, and a fourth oil circuit is existed between the second end surface and the thrust plate; the first oil circuit, the second oil circuit, the third oil circuit, and the fourth oil circuit are successively connected to form a liquid circuit; the impeller can be in a completely suspended state under a combined action of the first axial dynamic pressure, the second axial dynamic pressure, and the radial dynamic pressure; and wherein the bearing is further provided with a first communication hole, the first communication hole passes through the first end surface and the second end surface, and the first communication hole is connected with the second oil circuit and the fourth oil circuit.

12. The electronic device as claimed in claim 11, wherein the bearing is further provided with a second communication hole, the second communication hole passes through the inner circumference surface and the outer circumference surface of the bearing; the second communication hole is located between the first end surface and the second end surface, and the second communication hole is connected with the first oil circuit and the third oil circuit.

13. The electronic device as claimed in claim 11, wherein the inner circumference surface of the bearing is provided with a first dynamic pressure groove, and the radial dynamic pressure oil circuit is formed between the first dynamic pressure groove and the outer circumference surface of the shaft rod.

14. The electronic device as claimed in claim 11, wherein the first end surface is provided with a second dynamic pressure groove, and the second dynamic pressure groove is cooperated with the wheel hub to form the first axial dynamic pressure oil circuit.

15. The electronic device as claimed in claim 11, wherein the second end surface is provided with a third dynamic pressure groove, and the third dynamic pressure groove is cooperated with the thrust plate to form the second axial dynamic pressure oil circuit.

16. The electronic device as claimed in claim 11, wherein the wheel hub is provided with a thrust portion, the bearing is sandwiched between the thrust portion and the thrust plate; an outer edge of the first end surface is concaved to form a first ring groove; the thrust portion comprises a first convex ring, and the first convex ring is cooperated with the first ring groove.

17. The electronic device as claimed in claim 16, wherein a L-shaped communication gap is formed between the first convex ring and the first ring groove; an axial end of the shaft sleeve is clamped to an outer side of the first convex ring, and an outlet gap is formed between the first convex ring and the shaft sleeve; and a sealing layer is provided in the outlet gap for blocking the communication gap.

18. The electronic device as claimed in claim 11, wherein the shaft sleeve comprises a limiting boss, the limiting boss is arranged on one side of the shaft sleeve along the axial direction away from the wheel hub, the second end surface is cooperated with the limiting boss to form an oil storage space between the second end surface and the bottom plate, the oil storage space is connected with the fourth oil circuit.

* * * * *